United States Patent [19]
Coffman et al.

[11] Patent Number: 4,742,947
[45] Date of Patent: May 10, 1988

[54] OPTICAL SYSTEM FOR USE AS STAND ALONE UNIT OR WITH A DEVICE FOR ATTACHING MODULAR ELECTRONIC COMPONENTS TO OR REMOVING THEM FROM A SUBSTRATE

[75] Inventors: Bradford W. Coffman, Norcross, Ga.; Bobby L. Mason, Alexandria, Va.

[73] Assignee: Pace, Incorporated, Laurel, Md.

[21] Appl. No.: 921,220

[22] Filed: Oct. 21, 1986

[51] Int. Cl.$^4$ ............................................. B23K 37/00
[52] U.S. Cl. .................................... 228/105; 228/6.2; 228/20; 350/521; 350/522; 350/612; 350/631; 29/833; 269/903
[58] Field of Search .................. 228/105, 6.2, 20, 240; 350/521, 522, 612, 631, 507, 616, 631; 29/833; 269/903

[56] References Cited

U.S. PATENT DOCUMENTS

| | | | |
|---|---|---|---|
| 2,711,672 | 6/1955 | Nordbak | 350/615 |
| 3,357,091 | 12/1967 | Reissmueller et al. | 228/105 |
| 3,384,288 | 5/1968 | Miller | 228/6.2 |
| 3,713,575 | 1/1973 | Cushman | 228/6.2 |
| 4,602,417 | 7/1986 | Mesch et al. | 228/6.2 |
| 4,659,004 | 4/1987 | Fridman | 228/6.2 |

FOREIGN PATENT DOCUMENTS

| | | | |
|---|---|---|---|
| 2751651 | 5/1979 | Fed. Rep. of Germany | 29/833 |
| 2835341 | 2/1980 | Fed. Rep. of Germany | 29/833 |
| 128980 | 11/1978 | Japan | 228/105 |

*Primary Examiner*—Nicholas P. Godici
*Assistant Examiner*—Samuel M. Heinrich
*Attorney, Agent, or Firm*—Gerald J. Ferguson, Jr.; Michael P. Hoffman; Michael J. Foycik, Jr.

[57] ABSTRACT

A optical system for stand alone use or for use with a device for attaching modular electronic components to or removing them from a substrate, including a microscope which is horizontally rotatable through 0°, +90°, and −90° positions relative to a component to permit viewing of three sides of the component and thus facilitate alignment of the component terminals with leads on the substrate together with inspection of soldered joints. A unit for vertically rotating the microscope through 90° with respect to the component is also disclosed which includes means for quickly positioning and locking the microscope at a preset vertical orientation such as 45° to further facilitate the alignment and inspection functions. Mirrors are also disclosed which enable viewing of three or four sides of a component in the 0° horizontal position of the microscope whereby the above rotation of the microscope to the +90° and −90° positions may be avoided.

28 Claims, 9 Drawing Sheets

OPTICAL SYSTEM FOR USE AS STAND ALONE UNIT OR WITH A DEVICE FOR ATTACHING MODULAR ELECTRONIC COMPONENTS TO OR REMOVING THEM FROM A SUBSTRATE

RELATED APPLICATION

This application is related to copending application Ser. No. 649,065 filed Sept. 10, 1984 and assigned to the assignee of the subject application. The foregoing application is hereby incorporated herein by reference.

BACKGROUND OF THE INVENTION

This invention relates to an optical system which may be employed as a stand alone unit or for use with a device for attaching modular electronic components to or removing them from a substrate such as a printed circuit board.

Present day devices for removing or installing surface mounted electronic components from a substrate such as a printed circuit board include those which use a blast of hot air to melt the solder. In particular, these devices direct a blast of hot air at the terminals from the source above the component to simultaneously melt the solder on each. Such a device, for example, is disclosed in the above-mentioned co-pending application Ser. No. 649,065. Since the components are becoming increasingly smaller, and their proximity to one another on the printed circuit board is increasing, the above device not only provides a closely controlled and evenly distributed source of hot air sufficient to melt solder associated with component terminals or printed substrate conductors during installation or removal of the electronic component relative thereto but also rapidly and precisely directs this controlled hot air where desired via a nozzle or the like thereby minimizing the likelihood of melting the solder on the terminals of adjacent components or otherwise damaging the printed conductors on the substrate. The nozzle typically closely surrounds the component but is slightly spaced therefrom. From the foregoing, it can be seen a surface mounted component to be installed must have the terminals thereof precisely aligned with the ends of the printed conductors or pads on the board to insure no overlapping occurs and/or no solder is smeared on the substrate between the conductors printed thereon. In order to insure alignment of the component terminals with the printed conductors, it is necessary to view at least three sides of the component or chip. After proper alignment has been effected, the component will then be soldered to the board with the device of the copending application Ser. No. 649,065. An inspection must then be made to determine whether there are any misaligned, shorted, or poorly soldered areas or any non-contacting leads. This inspection procedure may require viewing of all four sides of the component. Hereafter, the term "alignment" applies to the procedure, as described above, which occurs prior to soldering of the component to the board while "inspection" occurs after the soldering procedure.

SUMMARY OF THE INVENTION

The present invention provides an optical system for use either as a stand alone unit or for use with a device for attaching modular electronic components to or removing them from a substrate where each component has a plurality of terminals disposed at the periphery thereof, the system including a microscope which can be swivelled through a horizontal 0°, +90° and −90° relative to the component and focused at each orientation for alignment and/or inspection. Means for quickly positioning and holding the microscope at a 45° angle with respect to vertical are also provided.

Moreover, in the system of the present invention, a novel two-sided mirror assembly is positioned adjacent the nozzle of a heater unit to thus effect direct viewing of the three component sides from a front position to effect the alignment and/or inspection described above. Moreover, a novel three-sided mirror is also provided which permits viewing of all four sides of the component whenever such viewing is necessary. This eliminates the shifting of the microscope as described above. The microscope can be used with or without these mirrors, and the mirror can be used with the nozzle of the heating device in place or with the nozzle removed.

BRIEF DESCRIPTION OF THE DRAWINGS

The invention will be further illustrated by reference to the accompanying drawing in which.

DESCRIPTION OF THE PREFERRED EMBODIMENTS

Figure 1:
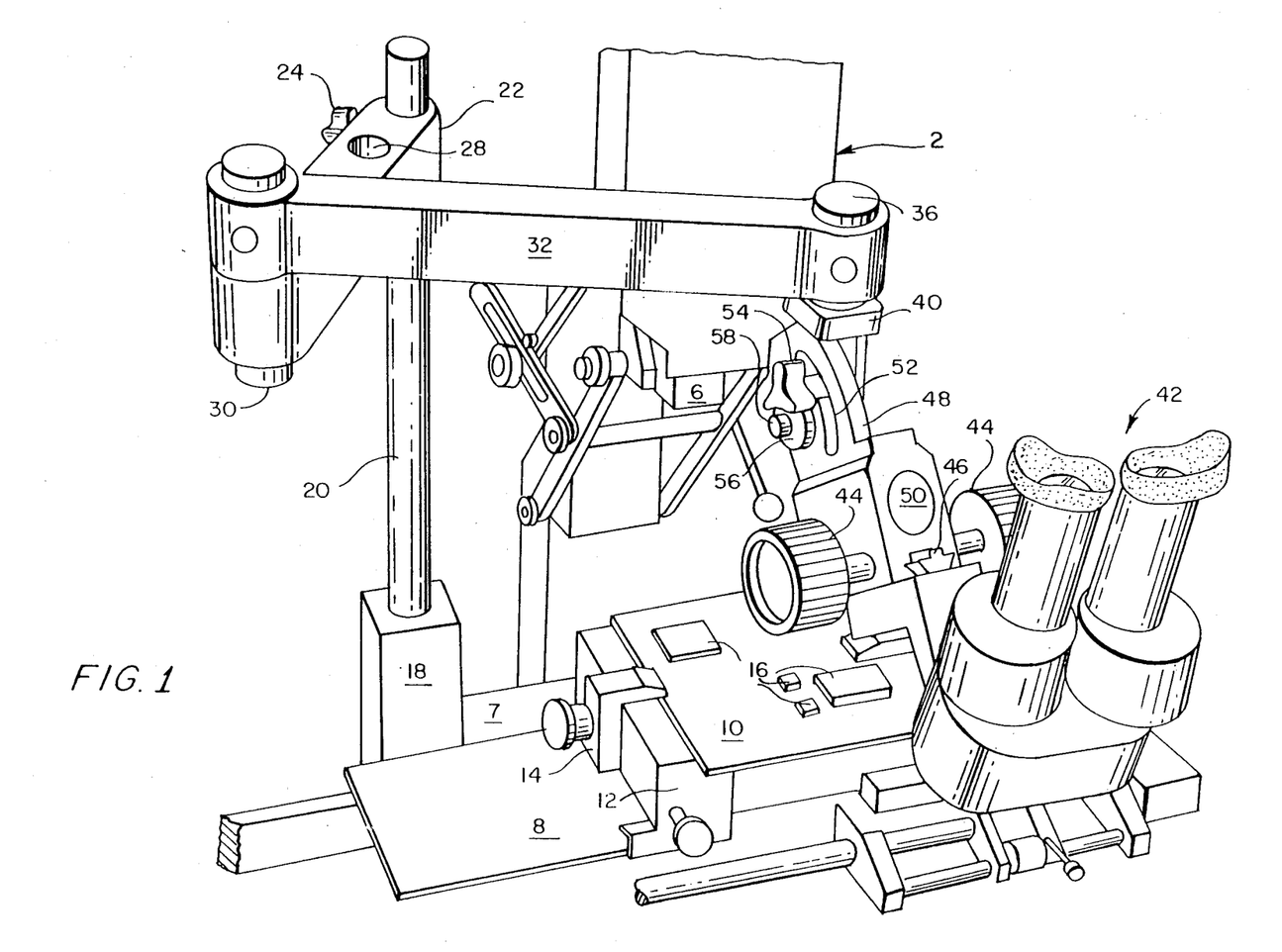
FIG. 1 is a perspective view of an illustrative embodiment of an optical system of the present invention shown in conjunction with a heating device of the type which is disclosed in the co-pending application, supra.

Referring to FIG. 1, a heater device 2 of the type disclosed in co-pending application Ser. No. 649,065, is shown mounted on a base plate (not shown), the heater device having the nozzle 6. Mounted in front of the heater device 2 is an X-Y table assembly 8 which is no part of the present invention and which was filed on 10/3/86 herewith in the names of Robert G. Brown, Robert S. Quasney, William J. Siegel and Louis A. Abbagnaro and entitled "X-Y Table with θ Rotation", this application being incorporated herein by reference.

The X-Y table assembly 8 has a printed circuit board 10 clamped thereon by means of the clamps 12 and 14. The printed circuit board 10 has a number of components 16 thereon.

Also secured to the base plate is a block 18 which non-rotatably supports the post 20, the post 20 being secured in the block 18 by means of a set screw, not shown.

Mounted on the post 20 is an arm 22, the arm 22 being rotatable about the post 20 and being capable of being locked in place by means of a screw having the handle 24. The position of the arm 22 on the post 20 is vertically adjustable by means of the locking collar 26, shown in FIG. 2, which may be locked in a vertical position on the post 20 by means of a set screw and handle, not shown.

The arm 22 has an aperture 28 therein, in order that the arm 22 may be removed from the post 20 and the post 20 inserted in the aperture 28, thereby shortening the effective length of the arm 22 for reasons which will be described below. At the end thereof, the arm 22 has a pin 30 non-rotatably received in an aperture therein, the pin 30 at the upper end thereof rotatably supporting the arm 32. The arm 32 may be locked in position relative to the pin 30 by means of a locking screw and handle 34 shown in FIG. 2.

Figure 2:
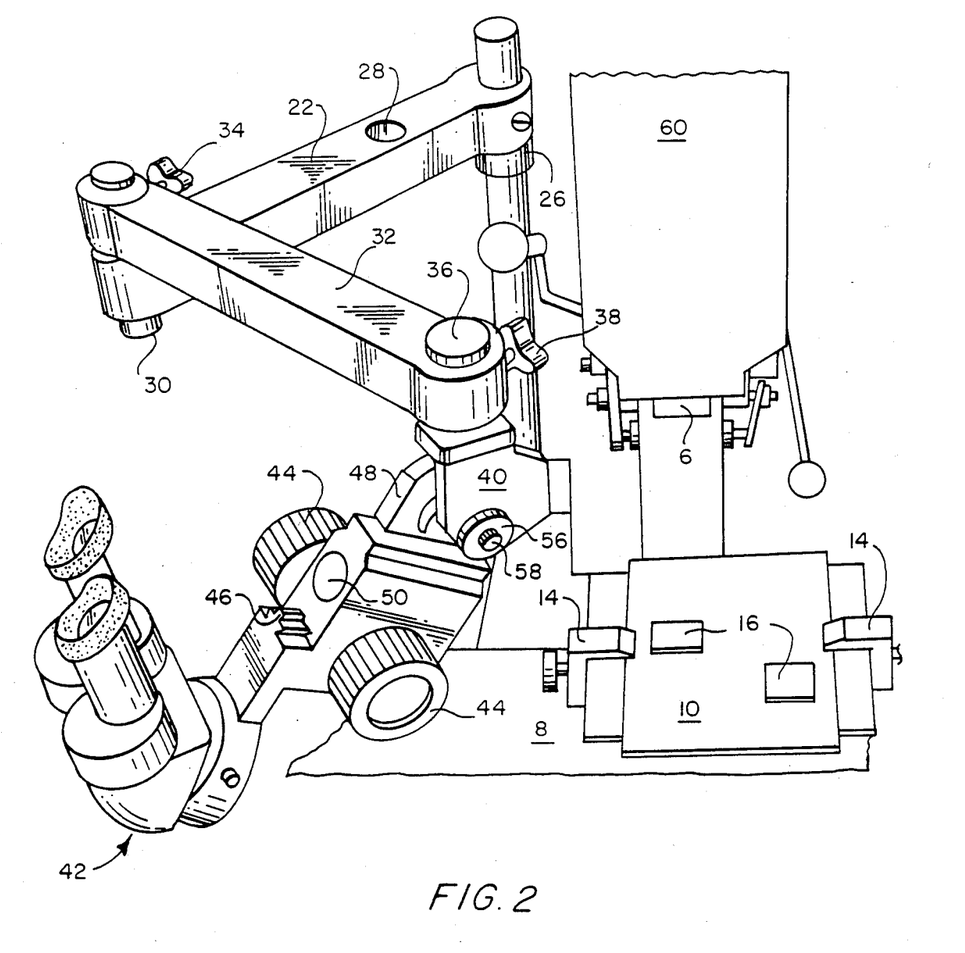
FIG. 2 is a perspective view, partially broken away, showing the microscope of the present invention rotated to the left of the heating device.

The arm 32 at the right-hand end thereof, as viewed in FIG. 1, receives the pin 36, which is rotatable in an aperture in the arm 32 and which may be locked in position by means of the set screw and handle 38 shown in FIG. 2. The lower end of the pin 36 is secured to a rotatable bracket 40 for pivotally mounting a microscope mount 48 for a microscope assembly 42, as will be described in detail hereafter with respect to FIGS. 11-15. The microscope assembly 42 is a conventional, commercially available item, such as that marketed under the name EKO, for example, and the microscope assembly per se is no part of the present invention. The microscope unit includes the focusing knobs 44 and the focusing slide 46. The microscope assembly is secured to a mount 48 by means of a pin 50. The mount 48 has the slot 52 therein through which passes a locking screw having handle 54. The microscope assembly 42 pivots about the pin 58 which passes through the mount 48 and the bracket 40 and is secured from falling out by means of the nuts 56.

FIG. 1 shows the microscope assembly 42 in a horizontal position of 0° relative to a component 16 on the circuit board 10. FIG. 2 shows the microscope assembly 42 swung toward the −90° position relative to a component 16 on the circuit board 10. The microscope assembly 42 is not shown in the full −90° position due to the difficulty of making this showing in a perspective view, but it is normally swung to the full −90° position when making an inspection of a component 16 on the circuit board 10. When the microscope assembly 42 is swung to the full −90° position, there may be instances in which the arm 32 will bind against the heater head 60 such as when assembly 42 in used with the heater unit of co-pending application Ser. No. 649,065, and in such case it is necessary to shorten the effective length of the arm 22. This may be effected by removing the arm 22 from the post 20 and inserting the post 20 in the aperture 28.

Figure 3:
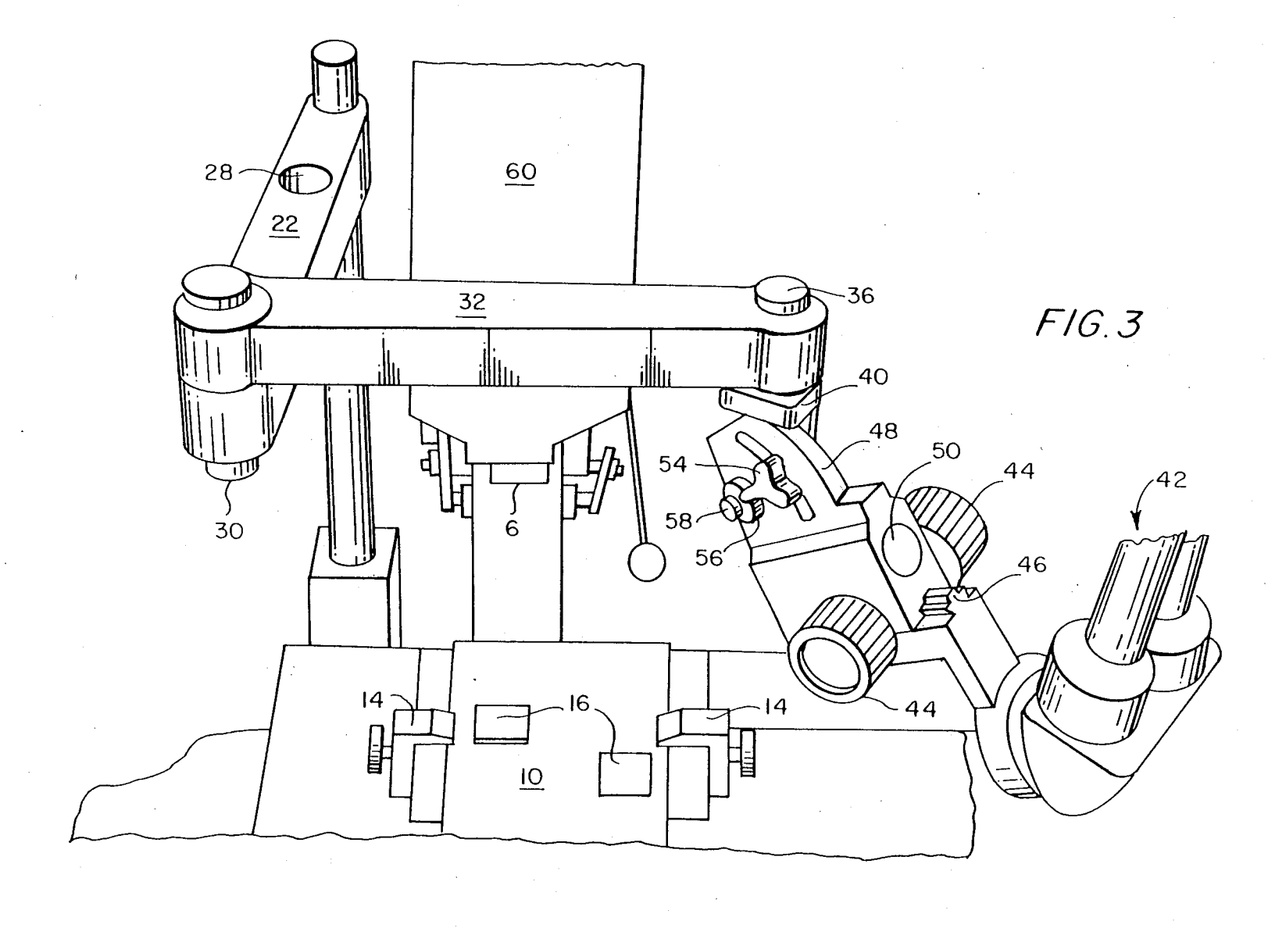
FIG. 3 is a perspective view, partially broken away, showing the microscope of the invention rotated to the right of the heating device.

FIG. 3 shows the microscope assembly swung toward the +90° position, although not shown in the full +90° position due to the difficulty of making such a showing in a perspective view. However, a component 16 on the circuit board 10 is normally viewed from three positions: 0°, −90°, and +90°, relative to the component 16. Of course, a component 16 on the board 10 may be viewed from any desired horizontal position of the microscope assembly 42 as well as any pivoted position thereof, the range of pivoting of the microscope assembly 42 in a vertical plane generally being 90° with the microscope being shown in its 45° position in FIGS. 1, 2 and 3 of the drawings.

Figure 4:
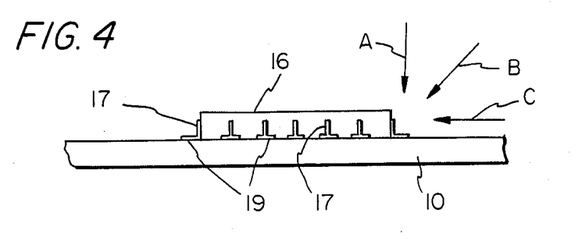
FIG. 4 is a diagrammatic illustration of the orientations in the vertical plane possible with the microscope of the present invention.

As shown in FIG. 4, a component 16, may have terminals 17 on the sides thereof which are to be aligned with leads or pads 19 on board 10 where the terminals and leads may be of any type used in such components and boards. As indicated by arrows A, B, and C, the view angle may be 90°, 45°, or 0° where with the 90° viewing angle, the pads 19 are primarily viewed; with the 45° angle, both the pads and terminals are substantially equally viewed; and with the 0° viewing angle, the terminals 17 are primarily viewed. From the foregoing it can be appreciated the 45° viewing angle is preferred for alignment of the terminals with respect to the leads and for inspection of soldered joints and thus this angle is illustrated in FIGS. 1–3 although it is to be understood the viewing angle may vary somewhat from 45° and still provide a good view of both the pads 19 and terminals 17. In other applications, of course, other viewing angles may be preferred.

Figure 5:
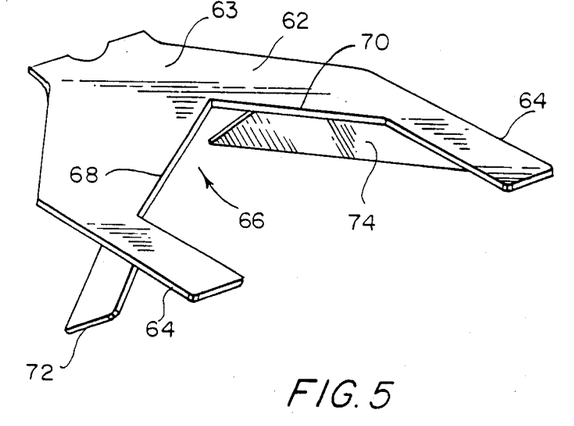
FIG. 5 is a perspective view of an illustrative embodiment of a novel two-sided mirror for viewing three sides of a component in accordance with the invention.
Figure 6:
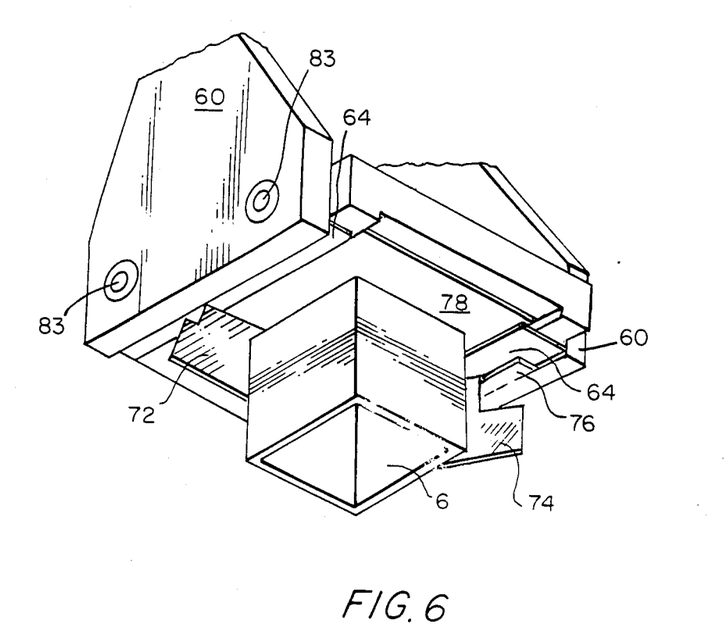
FIG. 6 is a perspective view of the mirror of FIG. 5 mounted on the heater of co-pending application Ser. No. 649,065 together with a nozzle.
Figure 7:
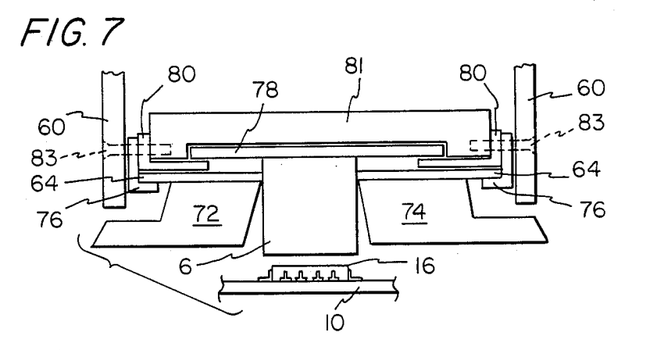
FIG. 7 is a front view of the mirror mounted on the heater of FIG. 6.

FIG. 5 shows a detail of a mirror assembly 62 which may be mounted at the lower end of the heater head 60 adjacent to nozzle 6 as shown in FIGS. 6 and 7. The mirror may be used with or without the nozzle 6 although typically the nozzle is in place and positioned over the component 16 as shown in FIG. 7. Thus, as soon as the component is aligned, the nozzle can be lowered slightly to surround the component preparatory to the soldering thereof with minimal motion of the system to insure maintenance of the aligned component terminals and leads.

The mirror assembly 62 is composed of a flat plate of stainless steel 63 having a V-shaped cut-out portion 66 which defines rectangular arms 64. The two sides 68 and 70 form an angle of typically 90 degrees with each other. Downwardly extending from the lower edges of the sides 68 and 70 are two reflecting surfaces 72 and 74 which may be polished stainless steel. The surfaces 72 and 74 are secured to the plate 63 by spot-welding, for example. The angle of the reflecting surfaces 72 and 74 with respect to plate 63 is less than ninety degrees and typically in the range of 60° to 80°, for example.

FIGS. 6 and 7 show the mirror assembly 62 of FIG. 5 in place at the lower end of the heater head 60 and the nozzle 6 also in place. As noted above, the mirror may be used with or without the nozzle 6. As can best be seen in FIG. 7, the mirror is held in place in the heater head 60 by means of a pair of elongated, L-shaped springs 76 on which arms 64 of the mirror slide to permit insertion and removal of the mirror assembly. The nozzle 6 includes an upper flange 78 and is held in place by means of a second pair of elongated, L-shaped springs 80 mounted above the first pair of springs 76 where flange 78 slides along the springs 80 to permit insertion and removal of the nozzle. The springs 76 and 80 are bolted to a lower plate 81 of the heater head 60 via bolts 83 which extend through (a) head 60 and (b)

springs 76 and 80 and which are threaded into plate 81. Also see FIG. 6. Thus, the nozzle is slidably mounted on the upper springs 80 and may be easily removed by sliding it out of the front of the heater head 60, and the mirror similarly may be removed by sliding it out of the rear of the heater head 60 on the lower pair of springs 76.

Figure 8:
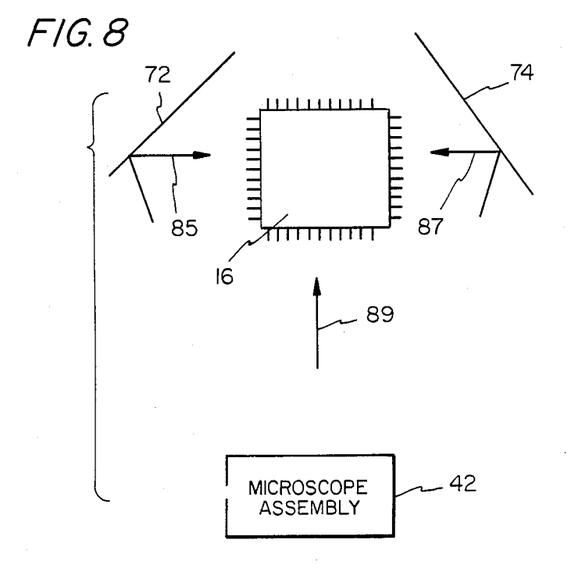
FIG. 8 is a plan diagrammatic view illustrating the operation of the mirror of FIGS. 5–7.

In operation, the nozzle 6 is lowered onto a component 16 on the circuit board 10 as shown in FIG. 7 and, with the microscope assembly 42 in the 0° position, three sides of the component 16 may be seen by virtue of the reflective surfaces 72 and 74 of the mirror as indicated in FIG. 8. In particular, as illustrated in FIG. 8, the sides of the component are viewed via reflected rays 85 and 87 while the front of the component is viewed directly by the microscope assembly since it is at its 0° horizontal position. Due to the inclination of the reflective surfaces 72 and 74 and the position of microscope assembly 42, the rays 85 and 87 are typically oriented about 45° with respect to the component 16 as indicated at B in FIG. 4. After the component has been soldered to the board and the heater head 60 has been raised, the nozzle 6 may be removed from the heater head by sliding it out of the front thereof on the springs 80 and the mirror 62 may then be lowered onto the circuit board adjacent the component 16 to view the soldered joints with the microscope assembly 42 in the 0° position and thus inspect the integrity of the soldered joints.

Also, the microscope assembly 42 may be used to inspect the integrity of soldered joints without using the mirror 62 by moving heater head 60 to its raised position shown in FIGS. 1, 2 and 3, and rotating the microscope assembly through the 0°, +90°, and −90° positions in order to view the component 16 on the circuit board 10 from these three different angles.

As can be appreciated from the foregoing, the inspection procedure can be effected by viewing only three sides of component 16. However, in some instances, it is desirable to inspect all four sides to insure joint integrity thereat. In general, inspection of three sides will insure integrity at the fourth side, assuming integrity is found at the three inspected sides. However, if one of the leads, for example on the uninspected fourth side happened to be bent, integrity at the three inspected sides would not necessarily insure integrity at the uninspected side. In practice, the component terminals may be inspected prior to placing the component on the board to effect alignment thereof with the board leads. Thus, such a prior inspection of the component terminals to determine if any are bent will normally alleviate the need for inspecting the fourth side, especially, of course, if the concern is whether a bent terminal is at the uninspected side. Hence, the two-sided mirror of FIGS. 5 through 8 will typically provide a desired degree of reliability with respect to the inspection process even through the fourth side is actually not viewed through the microscope assembly.

Figure 9:
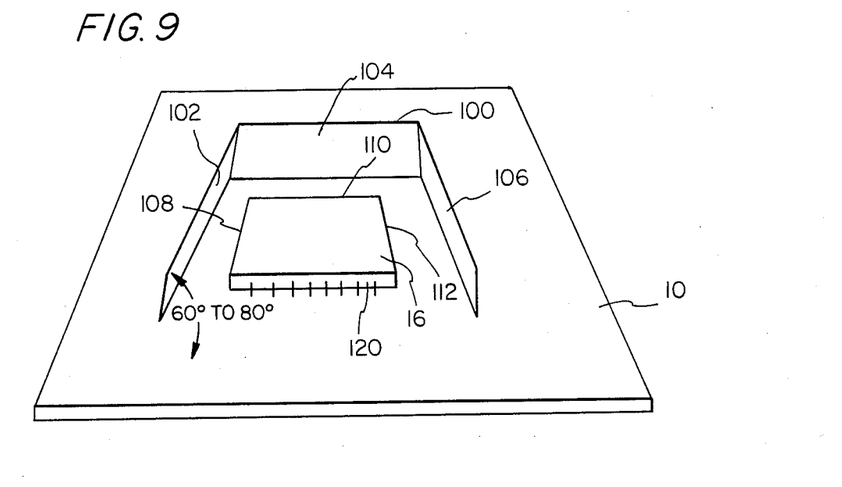
FIG. 9 is a diagrammatic, perspective view of an illustrative embodiment of a three sided mirror for viewing four sides of a component in accordance with the invention.
Figure 10:
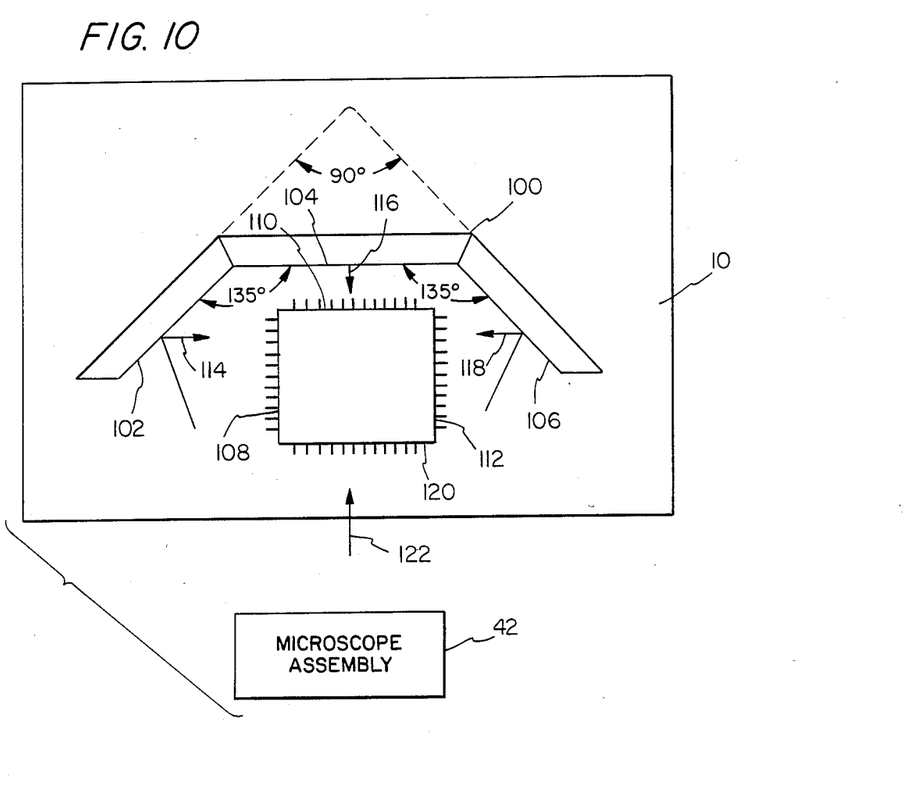
FIG. 10 is a plan diagrammatic view illustrating the operation of the mirror of FIG. 9.

In those instances, where it is felt inspection of the fourth side is necessary, the mirror assembly generally indicated at 100 in FIGS. 9 and 10 will permit inspection of all four sides of the soldered joints of the component. The mirror assembly 100 comprises three reflective surfaces 102, 104 and 106 for respectively viewing the sides 108, 110 and 112 of the component. The surfaces 102 and 106 correspond to surfaces 72 and 74 of mirror 62 of FIG. 5. The assembly 100 is simply placed in position on the board, after the nozzle has been raised, and, with microscope assembly 42 in its 0° position, sides 108, 110 and 112 are respectively viewed via reflected rays 114, 116 and 118 while the front side 120 is directly viewed via ray 122. Thus, it can be seen the mirror assembly 100 readily provides inspection of all four sides of component 16 when desired.

The reflecting surfaces 102 through 106 generally form an angle of 60° to 80° with respect to the surface of board 10, these angles being generally the same as those employed for reflecting surfaces 72 and 74 of mirror 62 of FIG. 5. Moreover, the angle between sides 102 and 106 when extended along the imaginary lines shown in FIG. 10 is typically about 90° and, in particular, the angle between adjacent ones of all three mirror surfaces is about 135° as also indicated in FIG. 10. Thus, mirror assembly 100 readily functions to permit inspection of all four sides of component 16.

Figure 11:
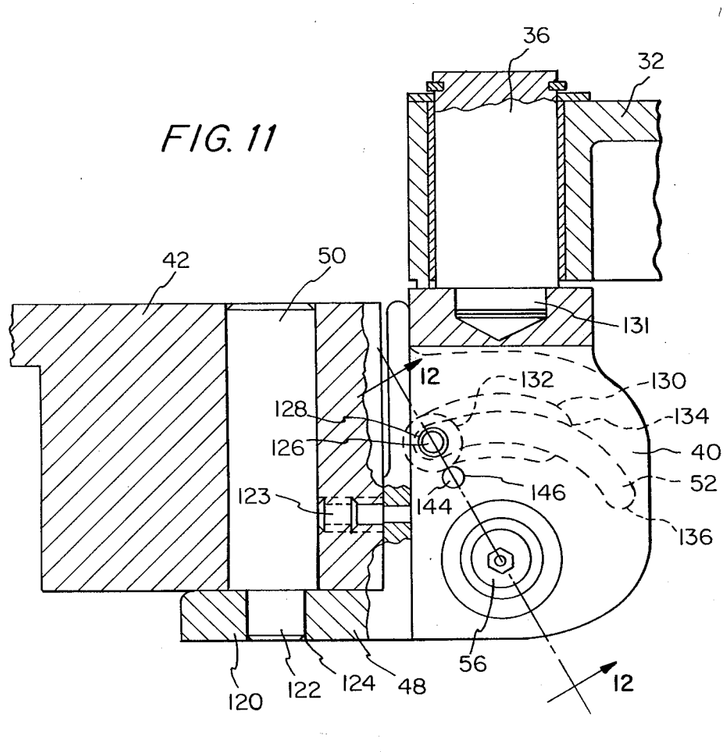
FIG. 11 is one side view of an illustrative microscope mount and rotatable bracket therefor in accordance with the invention.
Figure 12:
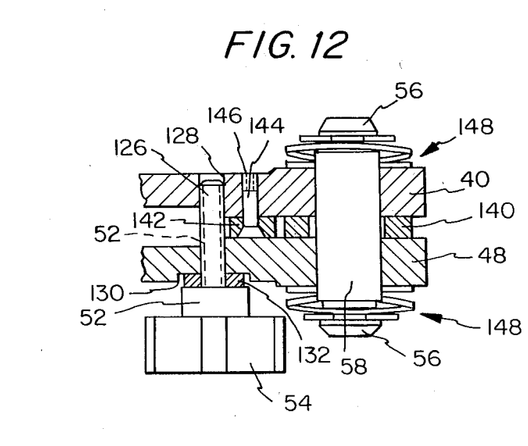
FIG. 12 is a cross-sectional view taken on the line 12—12 of FIG. 11, and FIGS. 13, 14 and 15 are the other side view of the mount of FIG. 11 showing the 90°, 45° and 0° vertical orientations thereof.
Figure 13:
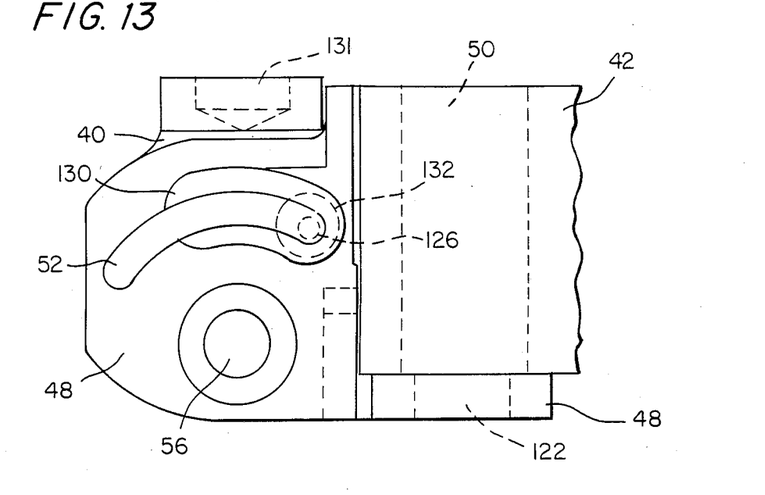
Figure 14:
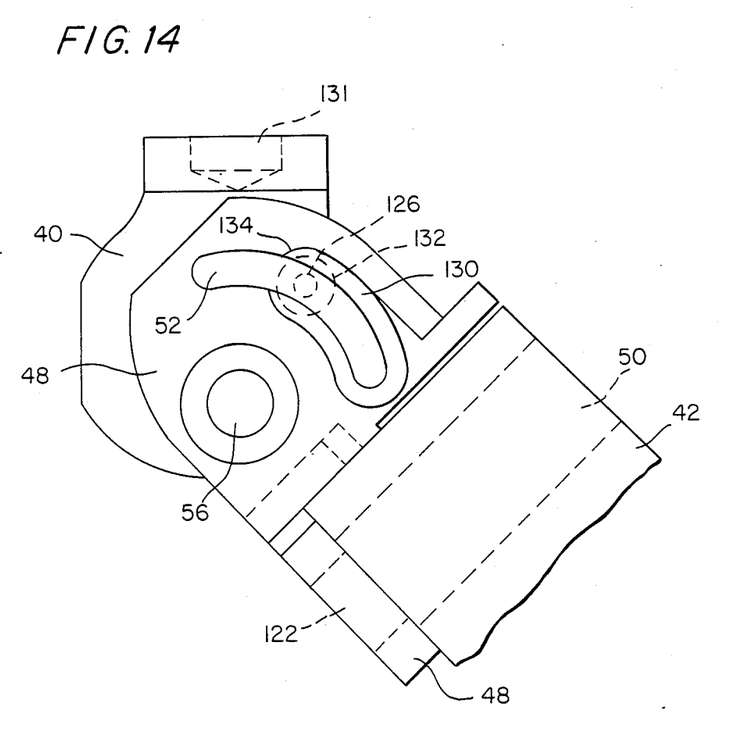
Figure 15:
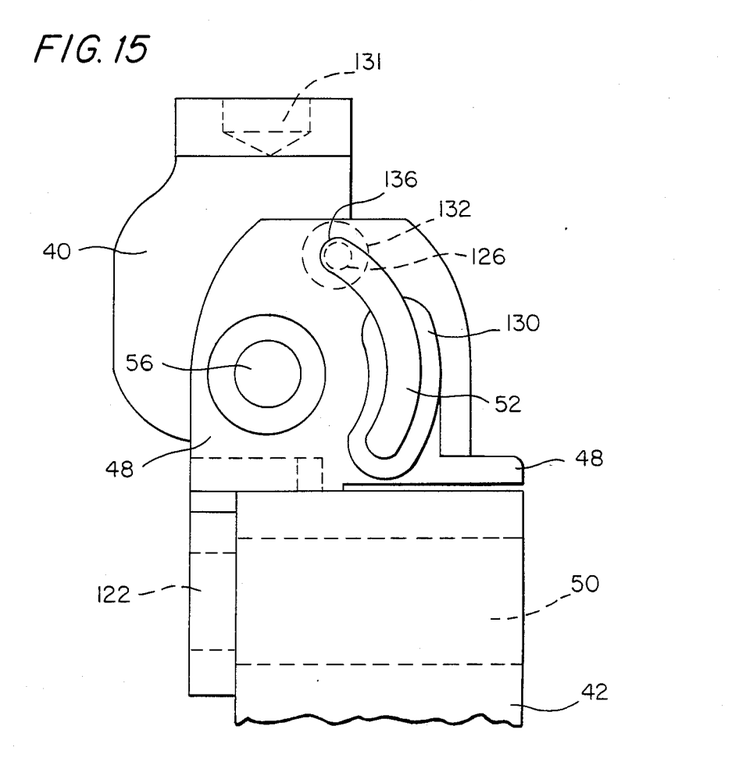

Referring to FIGS. 11 through 15, there is illustrated in further detail rotatable bracket 40, and microscope mount 48, and the members associated therewith for positioning microscope assembly 42 in the vertical plane. As shown in FIG. 11, pin 36 is rotatably mounted in the end of arm 32. Rotatable bracket 40 is fixably secured to pin 36 by a projection 131 extending from pin 36, the projection being threaded into engagement with bracket 40. Hence, bracket 40 rotates with pin 36. Microscope mount 48 is pivotally mounted to bracket 40 via a pin 58 as can best be seen in FIG. 12. Microscope mount 48 includes an extension 120 whereby pin 50 extends through microscope assembly 42 and includes a projection 122 which extends through an opening 124 in extension 120 of mount 48, as can be seen in FIG. 11. As also indicated in FIG. 11, the microscope assembly 42 is vertically oriented with respect to board 10 of FIG. 4 such that the viewing is in the direction of arrow A of FIG. 4. FIG. 13 is a side view of microscope mount 48, where the microscope is again in its vertical orientation with respect to the work. Thus, FIGS. 11 and 13, respectively, illustrate opposite sides of the assembled bracket 40 and microscope mount 48 where FIG. 11 illustrates the exposed side of the rotatable bracket and FIG. 13 the exposed side of the microscope mount. As can be seen in these figures, the microscope mount 48 includes slot 52 through which a locking screw 126 extends, the screw being threaded into a threaded opening 128 in rotatable bracket 40, as can be seen in FIG. 12. Disposed on the screw is a handle 54 for locking the microscope mount in a desired vertical orientation with respect to the rotatable mount 40. As stated above, FIGS. 11 and 13 illustrate the mount 40 locked in a position such that the microscope assembly is vertically oriented with respect to the work or board 10. FIG. 14 illustrates the mount 48 locked in a position where microscope assembly is oriented at a 45° angle corresponding to the arrow B of FIG. 4, while FIG. 15 illustrates the microscope mount 48 locked in a position where the microscope assembly is horizontally oriented as indicated by arrow C of FIG. 4.

Positioning of microscope mount 48 with respect to bracket 40 is effected by loosening screw 126 until the mount is no longer locked with respect to the bracket. The mount is then free to rotate about pivot pin 58. However, in accordance with the invention, provision is made for quickly and accurately setting the mount 48 at a preset angular orientation such as the 45° orientation of FIG. 4. Thus, in effect, free rotation of the mount occurs over a first angular range extending between the 90° orientation of FIG. 13 and the 45° orientation of FIG. 14 and a second angular range extending between the 45° orientation of FIG. 14 and to the 0° orientation of FIG. 15. That is, free rotation of the microscope mount with respect to bracket 40 may be limited to the above first angular range and then if desired, extended to the above second angular range.

The foregoing is effected by providing a groove 130 in microscope mount 48, the groove extending on both sides of the slot 52 over approximately one-half the length thereof. As can be seen in FIG. 12, the locking screw 126 has an annular disk 132 fixedly disposed thereon, the disk adapted to slide in groove 130 of mount 48. Disk 132 is made of Delrin or a suitable nylon or a similar material which is adapted to withstand high forces and yet can readily slide in groove 130. As long as the lock screw 126 is loosened to only such an extent that the disk 132 is disposed within groove 130, rotation of microscope mount 48 with respect to rotatable bracket 40 is restrained to the length of groove 130. Thus, the mount may be quickly pivoted until the end 134 of groove 130 engages disk 132 as illustrated in FIG. 14 where the disk 132 and locking screw are indicated by dotted lines, as is also the case in FIGS. 13 and 15. After locking screw 126 is tightened to lock mount 48 in place, the microscope assembly will be at its preferred 45° orientation with respect to the work, as discussed above and illustrated at arrow B of FIG. 4. In other words, the foregoing provides a means for quickly and accurately setting the microscope to the desired 45° orientation. No adjustment is required by the operator to achieve this orientation. It is automatically achieved by rotating the microscope mount 48 until end 134 of slot 130 engages disk 132.

If it is desired to rotate the microscope mount 48 through the 45° to 0° positions, the operator loosens locking screw 126 until disk 132 is completely removed from groove 130. The mount is now free to be rotated until the end 136 of slot 52 engages the locking screw. At this point, the microscope mount assumes the position shown in FIG. 15.

Referring to FIG. 11, there is shown a set screw 123 which is threaded through microscope mount 48 to engage pin 50 and thus lock the pin in place and hence lock the microscope mount with respect to microscope assembly 42. Referring to FIG. 12, disposed between rotatable bracket 40 and microscope mount 48 are spacers 140 and 142 where spacer 142 is fixed with respect to rotatable bracket 40 by screw 144 which extends through spacer 142 and is threaded into threaded opening 146 of rotatable bracket 40. Also provided are washers generally indicated at 148 for facilitating the rotation of microscope mount 48 with respect to rotatable bracket 40. Moreover, knob 54 includes an extension 55 mounted on locking screw 126. The annular disk 132 may be an integral extension of projection 55, if desired.

It will be obvious to those skilled in the art that many modifications may be made within the scope of the present invention without departing from the spirit thereof and the invention includes all such modifications.

What is claimed is:

1. An optical system for use with a device for attaching modular electronic components to or removing them from a substrate where each component has a plurality of terminals disposed at the periphery thereof and said substrate includes a plurality of leads respectively associated with said plurality of terminals, comprising:

post means, first arm means vertically adjustably and rotatably mounted on said post means, second arm means rotatably secured to said first arm means, and microscope means mounted on said second arm means, said microscope means being horizontally rotatable and vertically pivotable relative to said substrate for alignment of said terminals with said leads and/or inspection of soldered joints of the leads and terminals;

said component including at least four sides and said device for attaching or removing said components including (a) a source of heated air, (b) a nozzle adapted for surrounding the components but spaced therefrom for directing said heated air to said terminals and leads, and (c) mirror means where at least three of said sides of said component can be viewed through said microscope means via said mirror means to facilitate said alignment and/or inspection while maintaining said microscope means in a substantially horizontally aligned position with respect to said component.

2. A system according to claim 1 including aperture means in said first arm means whereby the effective length of said first arm means may be shortened.

3. A system according to claim 1 in which said microscope means is horizontally rotatable through at least 180° and vertically pivotable through at least 45°.

4. A system as in claim 1 including means for establishing a preset, vertical orientation of the microscope means with respect to the substrate and means for locking the microscope means at said preset vertical orientation.

5. A system according to claim 4 where said microscope means is vertically pivotable through at least 90° and said preset vertical orientation is approximately 45°.

6. A system as in claim 1 where said mirror means includes base plate means and two depending mirror sufaces secured to said base plate means.

7. A system as in claim 6 including means for removably mounting said mirror means with respect to said nozzle.

8. A system as in claim 6 where said mirror surfaces are at an angle of approximately 90° with respect to each other.

9. A system as in claim 8 where said depending mirror surfaces are secured to said base plate means at an angle in the range of about 60° to 80° relative to said base plate means.

10. A system as in claim 1 where said mirror means permits viewing of four sides of said components.

11. An optical system for use in aligning or inspecting components on a substrate, comprising:

post means, first arm means vertically adjustably and rotatably mounted on said post means, second arm means rotatably secured to said first arm means, and microscope means mounted on said second arm means, said microscope means being horizontally rotatable and vertically pivotable;

a means for selectively attaching and detaching components having terminals to the substrate;

said means for selectively attaching and detaching components including (a) a source of heated air, (b) a nozzle adapted or spacedly surrounding the components for directing said heated air to said terminals, and (c) a mirror means whereby at least three of said sides of said component can be viewed through said microscope means via said mirror means to facilitate said alignment or inspection of the components while maintaining said microscope means in a substantially horizontally aligned position with respect to the component.

12. A system according to claim 11 including aperture means in said first arm means whereby the effective length of said first arm means may be shortened.

13. A system as in claim 11 including means for establishing a preset, vertical orientation of the microscope means with respect to a workpiece and means for locking the microscope means at said preset vertical orientation.

14. A system as in claim 11 where said microscope means is vertically pivotable through at least 90° and said preset vertical orientation is approximately 45°.

15. An optical system for use with a device for attaching to or removing from a substrate a modular electronic component where said component has at least four sides and a plurality of terminals at each side and said substrate has a plurality of leads disposed thereon, comprising microscope means for viewing said terminals and leads to facilitate alignment of the terminals with the leads and/or inspection of soldered joints of the leads and terminals, and mirror means which are movably positionable to a location adjacent said component where at least three of said sides of said component can be viewed through said microscope means via the mirror means while maintaining the microscope means in a substantially constant position.

16. A system as in claim 15 where said microscope means includes means for vertically adjusting the position of the microscope means with respect to the component through an angle of at least 45°.

17. A system as in claim 16 where said angle is 90°.

18. A system as in claim 16 for establishing a preset, vertical orientation of the microscope means relative to the component and means for locking the microscope means at said preset angular orientation.

19. A system as in claim 18 where said preset angular orientation is about 45°.

20. A system as in claim 15 where said device for attaching or removing said components includes (a) a source of heated air, (b) a nozzle adapted for surrounding the components but spaced therefrom for directing said heated air to said terminals and leads, and (c) said mirror means mounted relative to said nozzle.

21. A system as in claim 20 where said mirror means includes base plate means and two depending mirror surfaces secured to said base plate means.

22. A system as in claim 21 including means for removably mounting said mirror means with respect to said nozzle.

23. A system as in claim 21 where said mirror surfaces are at an angle of approximately 90° with respect to each other.

24. A system as in claim 23 where said depending mirror surfaces are secured to said base plate means at an angle in the range of about 60° to 80° relative to said base plate means.

25. A system as in claim 15 where said mirror means permits viewing of four sides of said component.

26. A mirror for use with a device for attaching modular electronic components to or removing them from a substrate where each component has a plurality of terminals disposed at the periphery thereof and said substrate has a plurality of leads disposed thereon and where said device includes a microscope, comprising:
three connected mirror surfaces adapted for mounting with respect to said substrate where said surfaces are at predetermined angles with respect to each other, alignment and/or inspection of said terminals and leads being facilitated by viewing them through said microscope via said mirror surfaces; and
a movable support means for supporting said three connected mirrors, said movable support means being selectively movable toward and away from the component to adjustably position said three connected mirrors with respect to said component.

27. A mirror according to claim 26 in which said depending mirror surfaces are at an angle, in the range of about 60° to 80° relative to said substrate.

28. A mirror as in claim 26 where adjacent ones of said mirror surfaces are at about 135° angles with respect to each other.

* * * * *